(12) United States Patent  
Min et al.

(10) Patent No.: US 7,186,596 B2
(45) Date of Patent: Mar. 6, 2007

(54) VERTICAL DIODE FORMATION IN SOI APPLICATION

(75) Inventors: Byoung W. Min, Austin, TX (US); Laegu Kang, Austin, TX (US); Michael Khazhinsky, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/158,022

(22) Filed: Jun. 21, 2005

(65) Prior Publication Data

US 2006/0284260 A1 Dec. 21, 2006

(51) Int. Cl.
*H01L 29/72* (2006.01)

(52) U.S. Cl. ............... 438/149; 438/311; 257/347; 257/368; 257/173

(58) Field of Classification Search ........... 257/368, 257/173, 347; 438/382, 149, 311
See application file for complete search history.

(56) References Cited

U.S. PATENT DOCUMENTS

| 6,500,723 B1 | 12/2002 | Khazhinsky et al. ........ 438/382 |
| 6,653,670 B2 | 11/2003 | Ker et al. .................... 257/199 |
| 2003/0089948 A1 | 5/2003 | Min ............................ 257/347 |

OTHER PUBLICATIONS

Salman, A. et al., ESD Protection for SOI Technology using an Under-The-Box (Substrate) Diode Structure; 2004 EOS/ESD Symposium; 7 pages.

*Primary Examiner*—Edward Wojciechowicz
(74) *Attorney, Agent, or Firm*—John A. Fortkort; Fortkort & Houston P.C.

(57) ABSTRACT

A method for making a semiconductor device is provided. The method comprises (a) providing a semiconductor stack comprising a semiconductor substrate (203), a first semiconductor layer (205), and a first dielectric layer (207) disposed between the substrate and the first semiconductor layer; (b) forming a first trench in the first dielectric layer which exposes a portion of the substrate; (c) forming a first doped region (209) in the exposed portion of the substrate; and (d) forming anode (211) and cathode (213) regions in the first implant region.

20 Claims, 5 Drawing Sheets

VERTICAL DIODE FORMATION IN SOI APPLICATION

FIELD OF THE DISCLOSURE

The present disclosure relates generally to semiconductor devices, and more particularly to SOI devices having area diodes and to methods for making the same.

BACKGROUND OF THE DISCLOSURE

Electrostatic discharge (ESD) protection has emerged as a significant challenge for semiconductor devices. ESD, originating from such sources as mechanical chip carriers, plastic chip storage devices, or human contact, can generate voltages that are many times greater than the design voltages of integrated circuits. For example, the human body can supply an electrostatic discharge of up to 4 kilovolts, which can be devastating to integrated circuits that commonly operate at voltages of less than 5V.

In light of the challenge posed by ESD, many semiconductor circuits are now equipped with ESD dissipation features. However, in a typical semiconductor-on-insulator (SOI) technology, the presence of a buried oxide (BOX) layer places limitations on the structures that can be used for ESD protection. In particular, the presence of the BOX layer in SOI devices complicates the implementation of vertical NPN or diode structures. Moreover, the poor thermal conductivity of the buried oxide causes thermal failure levels to be much lower in SOI devices than in analogous bulk devices.

Accurate temperature sensing has also been a significant issue on power dissipation control in microprocessor SOI applications. The ideality factor of the diode has been recognized as a key parameter in temperature sensing devices. However, conventional lateral diodes in SOI applications exhibit high series resistance and poor thermal conductivity, causing a significant deviation from a diode ideality.

Despite the foregoing problems, diode structures have been built on SOI films that provide some ESD protection and temperature sensing capabilities. One example of such a diode structure is the conventional lateral diode 101 built on an SOI film which is shown in FIG. 1. The diode comprises a buried oxide layer 103 upon which is disposed a device layer 105 that includes cathode 107 and anode 109 implants and an N-well 111. A polysilicon gate 113 is disposed over the N-well 111 and is electrically insulated from the N-well 111 by a gate oxide layer 115. The polysilicon gate 113 is bounded on each side by spacers 117, 119.

While lateral diodes of the type depicted in FIG. 1 provide some ESD protection, the protection they afford is typically lower than that achievable with comparable bulk devices. More recently, however, it has been shown that further improvements in ESD protection can be achieved through the use of vertical diode structures. Such structures have been found to offer improved ESD protection compared to their lateral diode counterparts, due to improved lattice temperature distribution. Vertical diode structures offer the further advantage of occupying less space than their lateral counterparts.

An example of a vertical diode structure is depicted in FIG. 2. The vertical diode 151 depicted therein comprises a substrate 153 within which is defined an N-well 155. Anode 157 and cathode 159 regions are implanted in the N-well 155 and are in electrical contact with anode 161 and cathode 163 electrodes, respectively. A buried oxide (BOX) layer 165 is disposed over the N-well 155 adjacent to the anode 157 and cathode 159 regions. A shallow trench isolation (STI) layer 167 is disposed over the BOX layer 165 in the area next to the anode 157 and cathode 159 regions, and an SOI layer 171 is disposed over the BOX layer 165 elsewhere. An interlayer dielectric (ILD) 173 is disposed over the substrate 153 in the vicinity of the anode 157 and cathode 159 electrodes and over the SOI layer 171 and STI layer 167.

While vertical diode structures of the type depicted in FIG. 2 have some desirable attributes from an ESD protection perspective, they also have some significant disadvantages. In particular, vertical diode structures of the type depicted in FIG. 2 have relatively low packing densities, which is a significant disadvantage in light of the ongoing trend in the semiconductor industry towards further miniaturization. Moreover, since the N-well 155 underlies the STI 167 and BOX 165, it is very difficult to fabricate reproducibly in a conventional CMOS process.

There is thus a need in the art for methods and devices which address the aforementioned infirmities. In particular, there is a need in the art for SOI devices having ESD and/or temperature sensing structures which have higher packing densities with typical CMOS process compatibility, and for methods for making the same. There is further a need in the art for such SOI devices that exhibit thermal failure levels that are comparable to those observed in analogous bulk devices. These and other needs are met by the devices and methodologies described herein.

DETAILED DESCRIPTION

In one aspect, a method for making a semiconductor device is provided. In accordance with the method, a semiconductor stack is provided which comprises a semiconductor substrate, a first semiconductor layer, and a first dielectric layer disposed between the substrate and the first semiconductor layer. A first trench is formed in the first dielectric layer which exposes a portion of the substrate, and a first implant region is formed in the exposed portion of the substrate. Anode and cathode regions are formed in the first implant region.

In another aspect, a method for making a semiconductor device is provided. In accordance with the method, a substrate is provided which has a first semiconductor layer disposed thereon. A first dielectric layer is disposed between the substrate and the first semiconductor layer. A portion of the first dielectric layer is then exposed, and a second dielectric layer is formed over the exposed portion of the first dielectric layer. A trench is created which extends through the first and second dielectric layers and which exposes a portion of the substrate. Anode and cathode regions are then formed in the exposed region of the substrate.

In still another aspect, a semiconductor device is provided which comprises (a) a substrate having a first dielectric layer disposed thereon, (b) an implant region, disposed in said substrate, which has anode and cathode regions defined therein, (c) a trench which extends through said first dielectric layer, and (d) first and second contacts disposed in said trench which are in electrical contact with said anode region and said cathode region.

These and other aspects of the present disclosure are described in greater detail below.

It has now been found that the packing densities of vertical diode SOI devices can be significantly increased by utilizing a fabrication route that requires the formation of only a single trench in the buried oxide (BOX) layer for the formation of a deep well and/or the associated diode contacts. This approach may be facilitated, in some embodiments, by the use of suitable spacer structures. SOI devices can be made by this methodology which have ESD structures, and which exhibit thermal failure levels that are comparable to those observed in analogous bulk devices.

Figure 3:
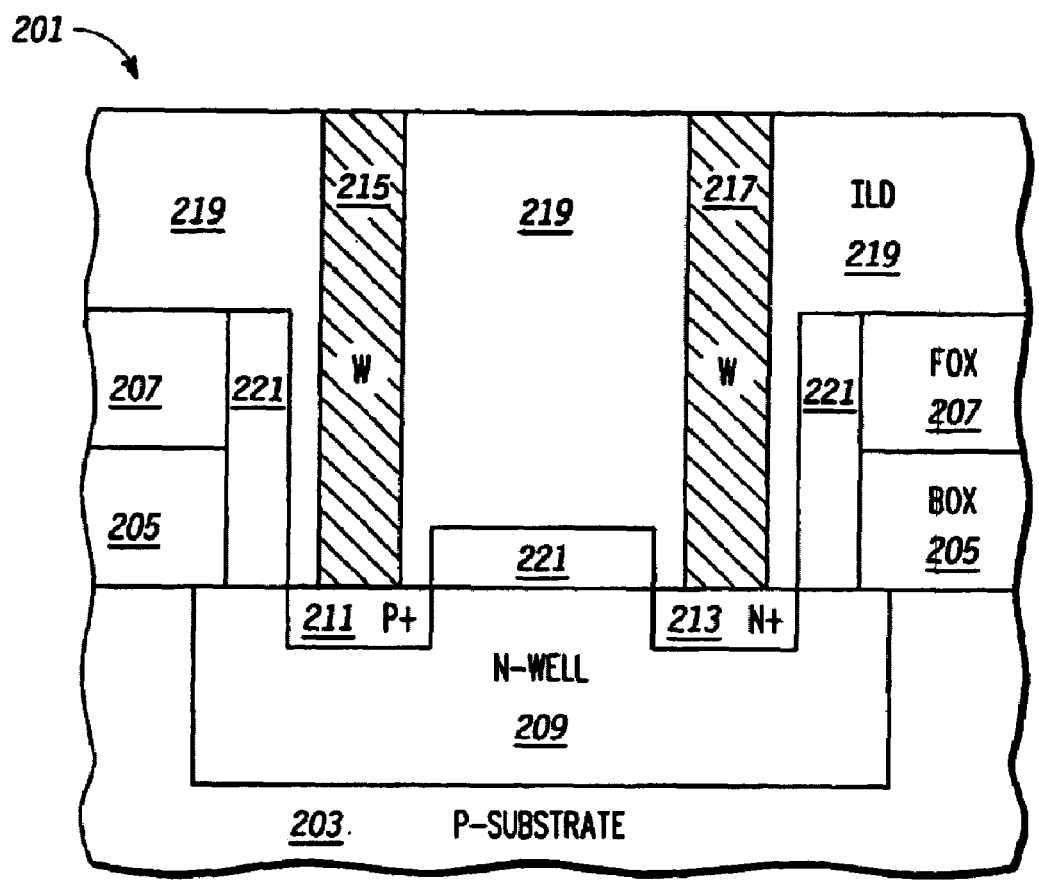
FIG. 3 is an illustration of an embodiment of area diode made in accordance with the teachings herein.

FIG. 3 illustrates a first non-limiting embodiment of a diode structure made in accordance with the teachings herein. As shown therein, the diode structure 201 comprises a substrate 203 upon which is disposed a layer of buried oxide (BOX) 205 and a layer of field oxide (FOX) 207. A deep well 209 is disposed in the substrate 203. In the particular embodiment depicted, the deep well 209 is an N-well, although it will be appreciated that similar devices could be made with reversed polarities. An anode region 211 and a cathode region 213 are implanted in the N-well region 209, and are in electrical contact with an anode electrode 215 and a cathode electrode 217, respectively. The structure is covered with an interlayer dielectric 219.

The structure of FIG. 3 also contains spacer structures 221. Such spacer structures are advantageous in that they can prevent the silicidation process (which is preferably used in fabricating the diode after the anode region 211 and the cathode region 213 have been defined) from creating an electrical short between the anode region 211 and the cathode region 213 or their associated electrodes.

Figure 1:
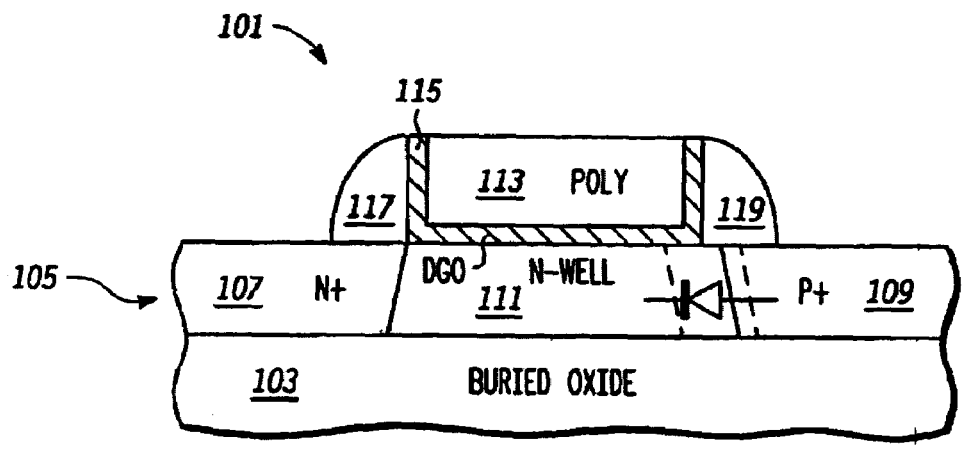
FIG. 1 is an illustration of a prior art lateral edge diode.
Figure 2:
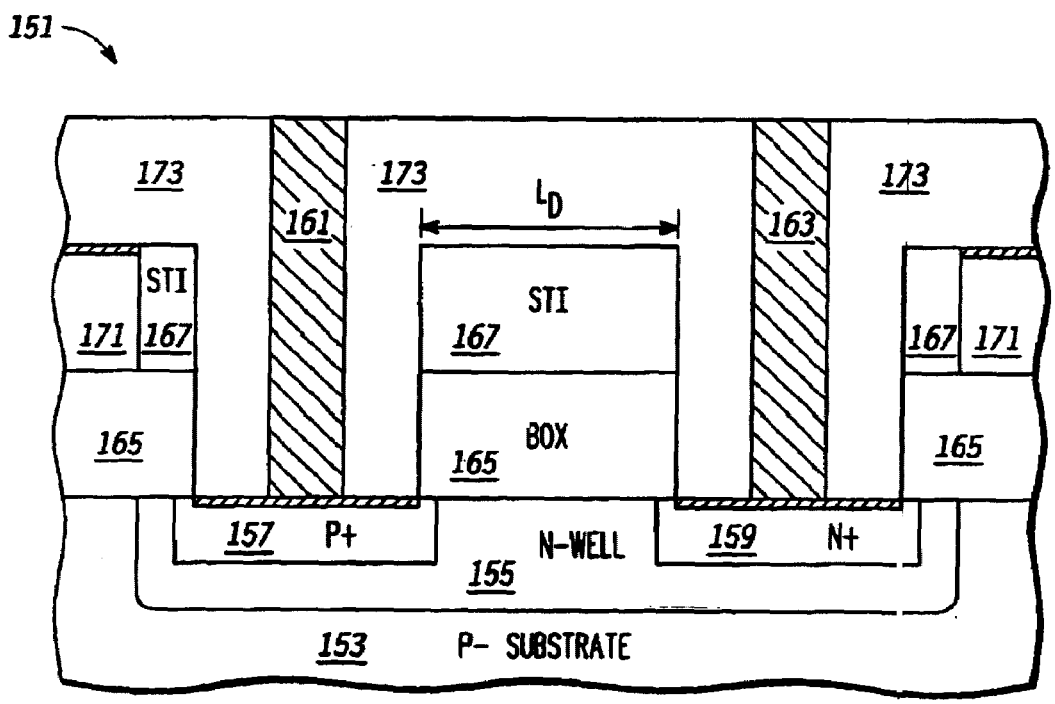
FIG. 2 is an illustration of a prior art vertical diode.

The structure depicted in FIG. 3 is advantageous over the prior art structure depicted in FIG. 2 in that the formation of the N-well/contact structures in the vertical diode 201 of FIG. 3 requires the formation of a single trench in the BOX 205 and FOX 207 layers. By comparison, the vertical diode 151 of FIG. 2 requires two such trenches. Since the combined variances in trench placement for two trenches is greater than the variance associated with a single trench, the packaging density for the vertical diode structure of FIG. 3 is inherently greater than the packaging density of the vertical diode of FIG. 2.

Figure 4:
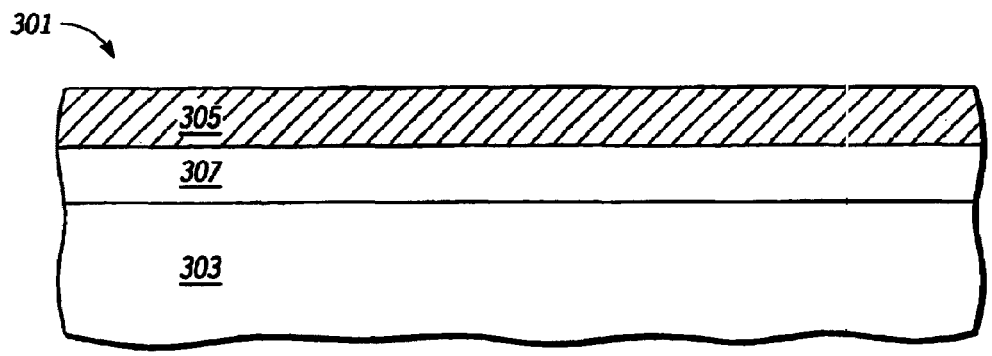
FIG. 4 is an illustration of one step in a process for making area diodes in accordance with the teachings herein.

FIGS. 4–12 illustrate one particular, non-limiting embodiment of a method that may be used to make a vertical diode structure of the type disclosed herein. With reference to FIG. 4, a wafer 301 is provided which contains a substrate 303. The substrate 303 may be a P-type or N-type substrate, and has a semiconductor layer 305 disposed thereon. A buried oxide (BOX) layer 307 is disposed between the semiconductor layer 305 and the substrate 303. A wafer of the type depicted in FIG. 4 may be formed, for example, from a handle wafer and a donor wafer using methods that are well known to the art.

The semiconductor layer 305 in the wafer depicted in FIG. 4 preferably comprises Si or Ge, and even more preferably comprises pure, single crystal Si or Ge, but may also comprise SiGe, GeC, SiGeC, or SiC. The BOX layer 307 preferably comprises silicon oxide, but may also comprise germanium oxide, silicon nitride, or other dielectric materials. It will be appreciated that the wafer 301 depicted in FIG. 4 may contain various other layers and features as are known to the art, but that these additional layers and features have been omitted for simplicity of illustration.

Figure 5:
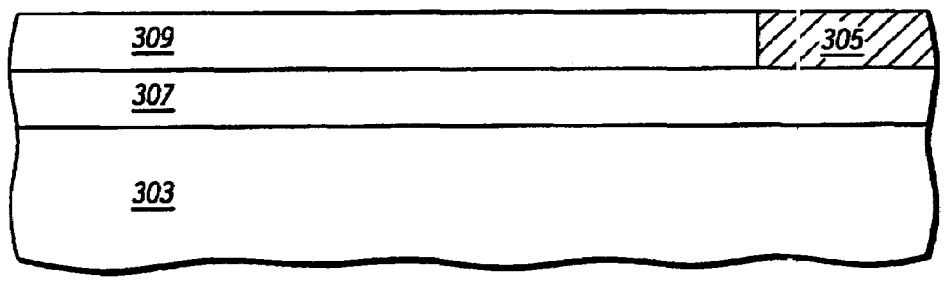
FIG. 5 is an illustration of one step in a process for making area diodes in accordance with the teachings herein.

As shown in FIG. 5, a portion of the semiconductor layer 305 is removed through the use of a suitable etching technique. In some embodiments, removal of the portion of the semiconductor layer may involve depositing a layer of photoresist over the semiconductor layer 305, patterning the photoresist to form a suitable mask, and treating the exposed portion of the semiconductor layer 305 with aqueous HF or another suitable etchant. The removed portion of the semiconductor layer 305 is then replaced with a field oxide (FOX) layer 309 using chemical vapor deposition (CVD) or another suitable technique. The FOX layer 309 preferably comprises silicon oxide, but may also comprise other dielectric materials.

Figure 6:
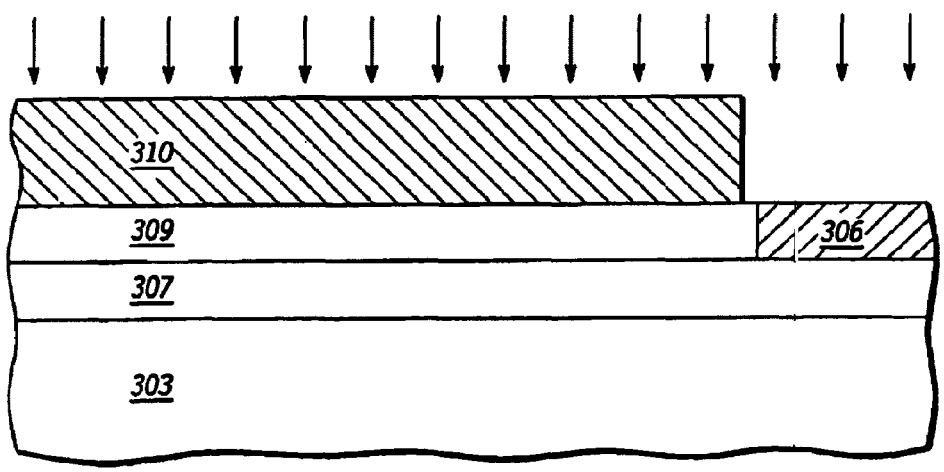
FIG. 6 is an illustration of one step in a process for making area diodes in accordance with the teachings herein.
Figure 9:
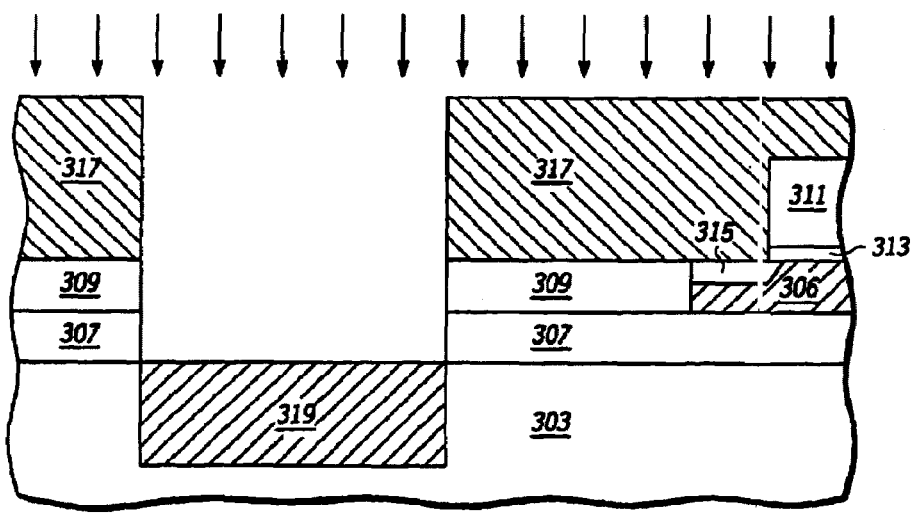
FIG. 9 is an illustration of one step in a process for making area diodes in accordance with the teachings herein.

As shown in FIG. 6, the structure is then patterned and masked using a suitable photoresist 310, and the resulting masked structure is subjected to ion implantation to define a shallow diode well 306 in the semiconductor layer 305 of FIG. 5. In the particular embodiment depicted, the shallow well 306 is a P-well, although in other embodiments, a similar methodology may be used in conjunction with a suitable dopant to form an N-well. It is to be noted that, in some variations of this method, a deep well implant could optionally be used to form the diode well 306 as a deep well in the substrate (a suitable method for creating a deep well in the substrate is illustrated in FIG. 9). The photoresist is subsequently stripped.

Figure 7:
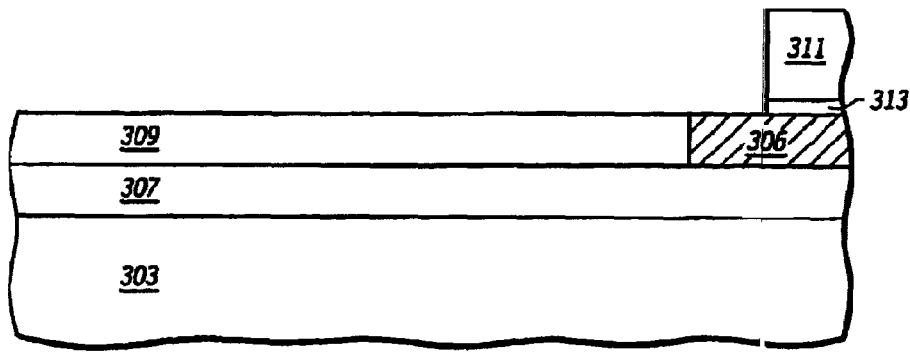
FIG. 7 is an illustration of one step in a process for making area diodes in accordance with the teachings herein.

As shown in FIG. 7, a gate dielectric 313 is subsequently formed over the shallow well 306, and a gate 311 is formed over the gate dielectric 313. These structures may be formed through suitable deposition, masking and etching techniques as are known to the art. The gate dielectric 313 may comprise various materials, including, but not limited to, silicon oxide, germanium oxide, and various metal oxides. The gate 311 may comprise polysilicon, various conductive metals, or other suitable gate materials as are known to the art.

Figure 8:
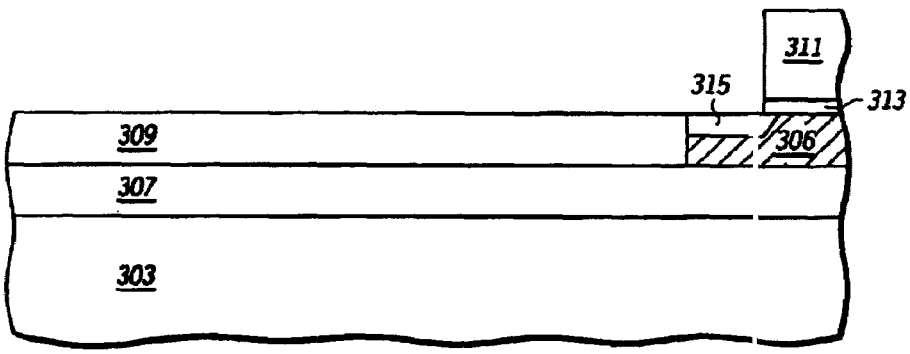
FIG. 8 is an illustration of one step in a process for making area diodes in accordance with the teachings herein.

Referring now to FIG. 8, one or more extension regions 315 are then formed in the shallow well 306. Preferably, the extension region is formed through shallow ion implantation used in conjunction with an implantation mask that exposes a portion of the shallow well 306 in the vicinity of the gate 311, although other suitable techniques may also be employed.

As shown in FIG. 9, a layer of photoresist 317 is then deposited over the structure, followed by masking and etching of layer 307 and 309 to define an aperture therein which exposes a portion of the substrate 303. The exposed portion of the substrate 303 is then subjected to ion implantation to define a deep well 319 therein. The deep well 319 may be an N-well or a P-well, and can optionally be followed by an SOI substrate window etch.

Figure 10:
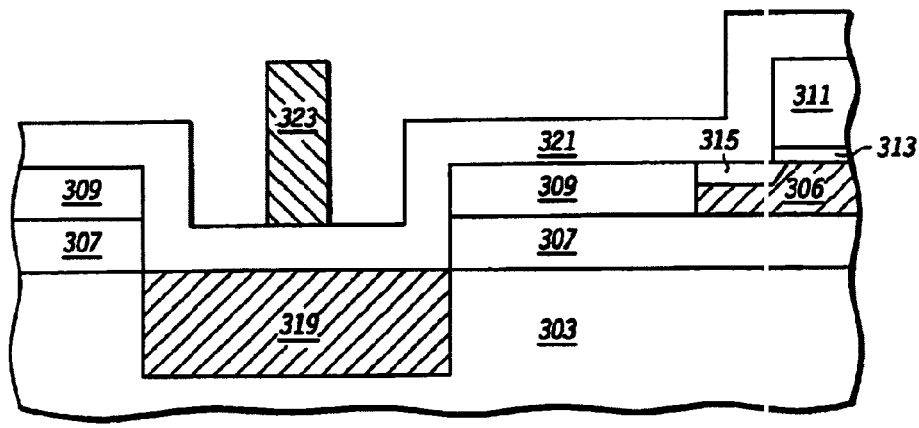
FIG. 10 is an illustration of one step in a process for making area diodes in accordance with the teachings herein.

Referring to FIG. 10, the layer of photoresist 317 depicted in FIG. 9 is then stripped, and a layer of spacer material 321 is deposited over the structure. Another layer of photoresist 323 is subsequently deposited over the layer of spacer material 321 and is patterned using suitable photolithographic techniques.

Figure 11:
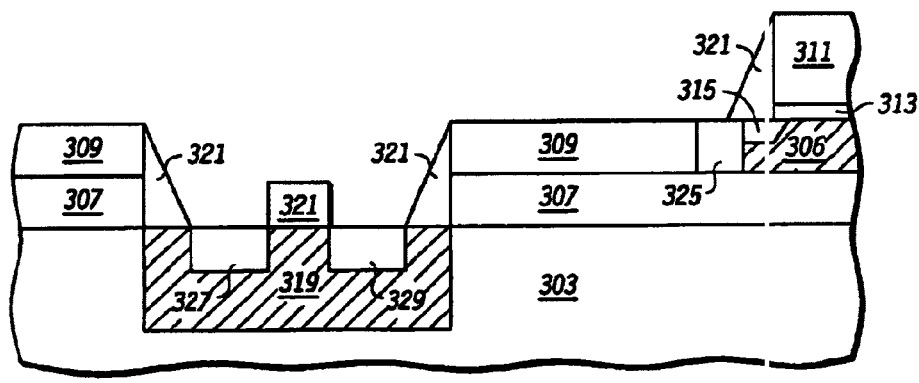
FIG. 11 is an illustration of one step in a process for making area diodes in accordance with the teachings herein.

As shown in FIG. 11, the layer of spacer material 321 is then etched using a suitable etchant to define spacer structures therein. A source or drain region 325 is subsequently defined in the shallow well 306, and anode 327 and cathode 329 regions are defined in the deep well 319. Implantation processes that may be used to form the anode 327, cathode 329 and source or drain 325 regions and the shallow 306 and deep 319 wells in the structures depicted herein are, by themselves, well known to the art and involve the use of suitable dopants. Depending on the polarity of the structure being formed, these dopants may include n-type species such as phosphorous or arsenic, or p-type species such as gallium or boron. A separate implant mask may be utilized for the formation of each of the anode 327 and cathode 329 regions.

In some cases, these implantation steps may be avoided through the incorporation of a suitable dopant into the materials of these regions as they are being formed. In some embodiments of the methodology described herein, the structure may be subjected to silicidation after the anode 327, cathode 329 and source or drain 325 regions have been defined, which will generally involve depositing a metal over the structure and exposing the structure to a heated atmosphere to form silicide wherever the metal contacts silicon (an analogous process may be used if other semiconductor materials are employed in place of silicon in the devices described herein).

Figure 12:
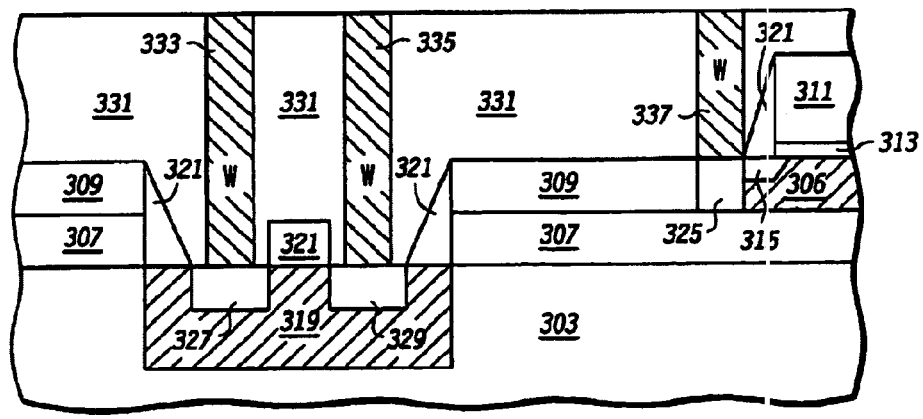
FIG. 12 is an illustration of one step in a process for making area diodes in accordance with the teachings herein.

As shown in FIG. 12, an interlayer dielectric (ILD) 331 is subsequently deposited over the structure. A series of apertures or trenches are formed in the ILD 331 as, for example, through the use of suitable masking and etching techniques. The apertures or trenches are then backfilled with tungsten or another suitable electrode material to form metal contacts 333, 335 and 337. The structure may optionally be subjected to chemical mechanical planarization (CMP) after deposition of the ILD 331, and either before or after formation of the anode 333 and cathode 335 contacts.

The ILD 331 may comprise silicon nitride, boron nitride, or other suitable ILD materials as are known to the art. The ILD 331 is subsequently masked and etched to define trenches therein which terminate at the surfaces of the anode region 327, the cathode region 329, and the source or drain region 325.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making a semiconductor device, comprising:
   providing a semiconductor stack comprising a semiconductor substrate, a first semiconductor layer, and a first dielectric layer disposed between the substrate and the first semiconductor layer;
   forming a first trench in the semiconductor stack which extends through the first semiconductor layer and the first dielectric layer, wherein the bottom of the first trench exposes a portion of the substrate;
   forming a doped region in the exposed portion of the substrate at the bottom of the trench; and
   forming cathode and anode regions in the doped region.
2. The method of claim 1, wherein the first trench extends into the substrate.

3. The method of claim 1, wherein the first trench does not extend through the substrate.

4. The method of claim 1, wherein the stack includes a second dielectric layer, and wherein the first trench extends through the second dielectric layer.

5. The method of claim 1, further comprising:
   forming an interlayer dielectric (ILD) over the second dielectric layer;
   forming second and third trenches which extend through the ILD and expose at least a portion of the anode and cathode regions, respectively; and
   forming electrical contacts in the second and third trenches.

6. The method of claim 5, wherein the ILD is formed by a deposition process, and wherein the ILD is subjected to chemical mechanical planarization (CMP) before the step of forming electrical contacts in the second and third trenches.

7. The method of claim 5, wherein the ILD is formed by a deposition process, and wherein the ILD is subjected to chemical mechanical planarization (CMP) after the step of forming electrical contacts in the second and third trenches.

8. The method of claim 5, wherein the ILD comprises a material selected from the group consisting of silicon nitride and boron nitride.

9. The method of claim 1, wherein the anode and cathode regions are formed by depositing a layer of spacer material over the doped region, and patterning the layer of spacer material such that first and second portions of the doped region are exposed.

10. The method of claim 9, further comprising implanting anode and cathode regions in the first and second portions, respectively, of the doped region.

11. The method of claim 10 wherein, after the anode and cathode regions are implanted, the structure is subjected to silicidation.

12. The method of claim 11, wherein the layer of spacer material is patterned such that a spacer structure is formed between the anode and cathode regions.

13. The method of claim 12, wherein the layer of spacer material is patterned such that the spacer material covers substantially the entire surface of the doped region exclusive of the anode and cathode regions.

14. The method of claim 13, wherein the semiconductor device is a vertical diode.

15. The method of claim 1, wherein the doped region comprises an N-well.

16. The method of claim 15, wherein the doped region further comprises N+ and P+ regions.

17. The method of claim 15, wherein the N+ region is formed through an implantation process utilizing a material selected from the group consisting of phosphorous and arsenic.

18. The method of claim 1, wherein the step of forming the doped region includes the steps of epitaxially growing a layer of semiconductor material on the portion of the substrate exposed within the first trench.

19. The method of claim 1, wherein the step of forming electrical contacts in the second and third trenches comprises the step of backfilling the second and third trenches with an electrode material.

20. The method of claim 1, wherein the doped region is a deep well.

* * * * *

UNITED STATES PATENT AND TRADEMARK OFFICE
CERTIFICATE OF CORRECTION

| | | |
|---|---|---|
| PATENT NO. | : 7,186,596 B2 | |
| APPLICATION NO. | : 11/158022 | |
| DATED | : March 6, 2007 | |
| INVENTOR(S) | : Byoung W. Min et al. | |

It is certified that error appears in the above-identified patent and that said Letters Patent is hereby corrected as shown below:

Title Page, Item (57)
<u>In the Abstract</u>

Please delete the entire Abstract and insert therefor:

-- A method for making a semiconductor device is provided. The method comprises (a) providing a semiconductor stack comprising a semiconductor substrate (203), a first semiconductor layer (205), and a first dielectric layer (207) disposed between the substrate and the first semiconductor layer; (b) forming a first trench in the first dielectric layer which exposes a portion of the substrate; and (c) forming anode (211) and cathode (213) regions in the exposed portion of the substrate. --

Signed and Sealed this

Seventeenth Day of July, 2007

JON W. DUDAS
*Director of the United States Patent and Trademark Office*